(12) United States Patent                    (10) Patent No.:     US 8,806,284 B2
Wang et al.                                  (45) Date of Patent:      Aug. 12, 2014

(54) METHOD FOR BIT-ERROR RATE TESTING OF RESISTANCE-BASED RAM CELLS USING A REFLECTED SIGNAL

(75) Inventors: Zihui Wang, Fremont, CA (US); Yuchen Zhou, San Jose, CA (US); Jing Zhang, Los Altos, CA (US); Yiming Huai, Pleasanton, CA (US)

(73) Assignee: Avalanche Technology Inc., Fremont, CA (US)

( * ) Notice: Subject to any disclaimer, the term of this patent is extended or adjusted under 35 U.S.C. 154(b) by 224 days.

(21) Appl. No.: 13/462,708

(22) Filed: May 2, 2012

(65) Prior Publication Data

US 2013/0294144 A1    Nov. 7, 2013

(51) Int. Cl.
G06F 11/00   (2006.01)
G11C 29/00   (2006.01)
G11C 29/50   (2006.01)
G11C 29/44   (2006.01)

(52) U.S. Cl.
CPC .......... *G11C 29/50008* (2013.01); *G11C 29/44* (2013.01)
USPC ........................... 714/721; 714/704; 714/723

(58) Field of Classification Search
None
See application file for complete search history.

(56) References Cited

U.S. PATENT DOCUMENTS

| | | | |
|---|---|---|---|
| 6,262,625 B1 * | 7/2001 | Perner et al. | 330/2 |
| 6,927,569 B2 | 8/2005 | Worledge et al. | |
| 7,323,890 B2 | 1/2008 | Petersen et al. | |
| 7,732,881 B2 | 6/2010 | Wang | |
| 7,738,289 B2 * | 6/2010 | Wang et al. | 365/158 |
| 7,863,911 B2 | 1/2011 | Hong et al. | |
| 2003/0103395 A1 * | 6/2003 | Ooishi | 365/201 |
| 2009/0256220 A1 | 10/2009 | Horng et al. | |
| 2009/0285017 A1 | 11/2009 | Yamane et al. | |
| 2010/0033881 A1 | 2/2010 | Carey et al. | |
| 2010/0096716 A1 | 4/2010 | Ranjan et al. | |
| 2011/0239065 A1 | 9/2011 | Byom et al. | |
| 2012/0161780 A1 * | 6/2012 | Choi | 324/537 |

OTHER PUBLICATIONS

R. Beach, et al.; A Statistical Study of Magnetic Tunnel Junctions for High-Density Spin Torque Transfer-MRAM(STT-MRAM); MagIC-IBM MRAM Alliance, MagIC Technol., Inc., Milpitas, CA. Conference Proceeding: Jan. 2009; DOI:10.1109/IEDM.2008.4796679, In proceeding of: Electron Devices Meeting, 2008. IEDM 2008. IEEE International.

Tai Min, et al.; A Study of Write Margin of Spin Torque Transfer Magnetic Random Access Memory Technology; IEEE Transactions on Magnetics, vol. 46, No. 6, Jun. 2010, pp. 2322-2327.

* cited by examiner

*Primary Examiner* — Daniel McMahon
(74) *Attorney, Agent, or Firm* — G. Marlin Knight

(57) ABSTRACT

A testing method is described for performing a fast bit-error rate (BER) measurement on resistance-based RAM cells, such MTJ cells, at the wafer or chip level. Embodiments use one or more specially designed test memory cells fabricated with direct electrical connections between the two electrodes of the cell and external contact pads (or points) on the surface of the wafer (or chip). In the test setup the memory cell is connected an impedance mismatched transmission line through a probe for un-buffered, fast switching of the cell between the high and low resistance states without the need for CMOS logic to select and drive the cell. The unbalanced transmission line is used generate signal reflections from the cell that are a function of the resistance state. The reflected signal is used to detect whether the test cell has switched as expected.

20 Claims, 5 Drawing Sheets

Example for Adequate Write Voltage & BER ~ 0

Example Using Insufficient Write Voltage to Cause High BER

US 8,806,284 B2

METHOD FOR BIT-ERROR RATE TESTING OF RESISTANCE-BASED RAM CELLS USING A REFLECTED SIGNAL

FIELD OF THE INVENTION

The present invention relates to the techniques for testing or screening memory cells that use distinct resistance states to store data such as magnetic random access memory (MRAM), phase change RAM, resistive RAM, and Memristors.

BACKGROUND OF THE INVENTION

The data storage component of an STT-MRAM (Spin Torque Transfer Magnetic Random Access memory) is a magnetic tunnel junction (MTJ) cell. The write operation uses electrical current to switch the magnetization direction of the free layer (storage layer) relative to that of the reference layer of the MTJ.

A typical type of magnetoresistive random access memory (MRAM) cell including a magnetic tunnel junctions (MTJ) will be described as examples of devices that can be used with the method of the invention. An MTJ can be designed for in-plane or perpendicular magnetization of the MTJ layer structure with respect to the film surface. The MTJ includes a free magnetic layer, a nonmagnetic spacer or junction layer, and a reference magnetic layer. Additional layers can be included such as an antiferromagnetic exchange coupling layer, a pinned magnetic layer and an antiferromagnetic layer. An MRAM cell structure typically includes a top metal contact and a bottom metal contact. The metal contacts are also referred to as electrodes. The reference magnetic layer has a fixed magnetization direction. The free magnetic layer has a magnetization direction that is switchable in either of two directions. The resistivity of the whole MTJ layer stack changes when the magnetization of the free layer changes direction relative to that of the reference layer, exhibiting a low resistance state when the magnetization orientations of the two ferromagnetic layers are substantially parallel and a high resistance when they are anti-parallel. Therefore, the cells have two stable states that allow the cells to serve as non-volatile memory elements.

The MRAM cells in an array on a chip are connected by metal word and bit lines. Each memory cell is connected to a word line and a bit line. The word lines connect rows of cells, and bit lines connect columns of cells. Typically CMOS control structures include a selection transistor which is electrically connected to the MTJ stack through the top or bottom metal contacts. The direction of the current flow is between top and bottom metal contacts.

Reading the state of the cell is achieved by detecting whether the electrical resistance of the cell is in the high or low state. Writing the cells requires a sufficiently high DC current flowing through the MTJ stack between the top and bottom metal contacts to induce a spin transfer torque that orients (switches) the free layer into the desired direction. The amount of current needed to write the cell is at least slightly higher than the current that flows during the read process, so that a read operation does not change the state of the cell.

The bit-error rate (BER) is defined, herein as the number of un-switched events divided by the total number of switching attempts, under the same writing condition, on a given MTJ cell. For commercial application of STT-MRAM, the data writing, i.e. free layer switching process by a write current, must have a very low bit-error rate. For example, it has been suggested that commercialization of STT-MRAM with 64 Mb density, requires a $10^{-9}$ BER for both read and write operations. Detection of such very low BER values requires a comparably large number of switching attempts and reading operations which can require elapsed times that are impractical and/or too costly using the prior art. For example, traditional BER measurement of MTJ cells at the wafer level uses a pulsed write operation, followed by a slow speed read (resistance sensing), and then a reset by a field or a reverse pulse. This entire process is too slow ($<10^3$ attempts per second) to enable large ($\geq 10^7$) amount of switching events on large number of devices for statistical significance.

Using the prior art testing method, to produce more than 100 k ($10^5$) switching attempts per second and record the switching result after each attempt, each MTJ cell will need to be embedded in a STT-MRAM CMOS circuitry, and also packaged, to enable STT-MRAM memory test utilizing the logic of the CMOS circuit.

Therefore, there is a need for a way to test the BER of MTJ cells with a rate of more than $10^5$ switching per second at the wafer level. Such a method can provide a valuable advantage in predicting MTJ cell BER performance in real world applications at early MRAM development stages and, therefore, reduce cost significantly. Additionally, by correlating BER performance across wafers with known MTJ properties can also provide insight of physical causes of bit-errors and reduce STT-MRAM development time to reach the target BER specification.

SUMMARY OF THE INVENTION

An object of the present invention is to describe a testing method and test apparatus for performing a much faster bit-error rate (BER) measurement on resistance-based RAM cells at the wafer or chip level than is possible using the prior art. The invention can be used to test any type of memory cell that uses changes in resistance (resistance-based RAM) to store data. This includes MRAM, phase change RAM, resistive RAM and Memristors. The detailed description of the embodiments will use MTJ-MRAM as an example, but the invention should be understood to apply to more broadly to the category of resistance-based RAM devices.

Embodiments of the method use one or more specially designed test memory cells on wafers or chips. Each test cell is fabricated with direct electrical connections between the two electrodes of the cell and external contact pads (or points) on the surface of the wafer (or chip) that can be accessed by standard test probes. The invention uses the direct electrical access to the memory cell to connect a transmission line to the cell for un-buffered, fast switching of the cell between the high and low resistance states at a high rate without the need for CMOS logic to select and drive the cell. A test setup according to an embodiment of the invention configures the system impedance to be unbalanced so that a portion of the signal is reflected from the cell on the transmission line. The invention uses the reflected signal to efficiently detect whether the test cell has switched as expected by analyzing the changes in reflected signals on the transmission line that occur when the resistance shifts. Thus, unlike the prior art, the invention can perform BER tests at very high speeds without the need for the associated CMOS logic for addressing, reading and writing the cells. Experiments have shown that the invention can reduce BER test time to less than 1% of time required by the prior art.

The simplicity and speed of a test method according to the invention makes it particularly useful for estimating the BER for MTJ cell designs early in the development process. The test can be performed using a test wafer fabricated with one or more test memory cells, but test cells according to the invention can also be formed on production wafers that also have memory cell arrays that are fully integrated with CMOS logic.

Embodiments of the invention use a test setup in which the system impedance presented by the probe connected to the test cell is intentionally mismatched to generate signal reflections from the test cell that are a function of the resistance state of the memory cell. For example, the system impedance can be selected to be lower than the impedance of the test cell when it is in the low resistance state, which will ensure that reflections occur when the cell is in either resistance state. When the resistance of the memory cell changes the reflected signal will change in a measurable way. Thus, the reflected signal is a proxy for the resistance of the cell which in turn is a function of the orientation of the free layer. Because the impedance presented by a typical MTJ memory cell under the test conditions is significantly higher than the standard 50 ohms impedance of off-the-shelf laboratory equipment, a test system embodiment can use standard equipment of off-the-shelf laboratory equipment having 50 ohms nominal impedance.

In one embodiment the input test signal for the testing the BER of the cell is a sequence of alternating polarity pulses selected to rapidly switch (toggle) the orientation of the free layer and, therefore, the resistance of the cell. The number of switching operations in a complete test must be high enough, e.g. $10^7$ or higher, to give a statistically significant result for the anticipated very low BER. Because the cell is directly accessible, the switching (write/reset) cycles can reach $10^7$ per second or higher in a test according to the invention which greatly shortens the test time for wafer level BER testing. The high rate of switching allows a statistically significant test at a given voltage to be completed in seconds rather the minutes required with the prior art. The invention reduces the total BER testing time by multiple decades compared to the traditional method.

When the cell toggles as expected, the reflected signal on the transmission line changes in a regular pattern. The invention utilizes deviations from the expected in the pattern of reflected signals to efficiently detect switching failure even if the failures occur only once in hundreds of millions of attempts. In one embodiment the success/failure of the switching operation is judged by measuring (sampling) the voltage level of the reflected pulse in selected window during each switching cycle. When the voltage level of the reflected pulse is outside of the acceptable range, an error has been detected.

The test sequence of alternating polarity pulses can be considered to be a series of reset and write operations for the MTJ, i.e. one reset pulse followed by one write pulse. In an embodiment the voltage level of the reflected pulse generated by the writing pulse is sampled in synchrony with a test clock signal to judge success/failure of the write operation. In an alternative embodiment, success/failure can be determined by measuring the reflected signal voltage level generated by an additional read pulse included after each write pulse in the test signal. The voltage level and the width of the read pulse in the alternative case are selected so that it is insignificant to the MTJ switching statistics.

Once the concepts of the invention are understood, the implementation of the test system's switching error detection means can implemented in a variety of ways using standard electrical engineering techniques and equipment. For example, one embodiment uses a commercially available oscilloscope as a voltage monitoring device (VMD) to repeatedly measure the voltage of the reflected signal in a selected sampling window in each cycle of the test signal. The stream of digitized voltage values is then passed to a computer which detects any switching errors by determining when the voltage value falls outside of the predetermined range of expected values. The computer based detection can be implemented using standard software programming techniques. Many other devices can be used for the switching error detection. For example, as an alternative to passing the raw stream of digitized voltage values to a computer, a VMD could be selected or designed to perform more of the work of detecting and counting the pulses that indicate switching errors as described herein. The VMD device can include an error counter which is incremented each time the measured reflected signal in the sample window deviates from the predetermined value. The value of the error counter can then be read directly or passed to the computer.

The test system with a test cell connected can be self-calibrated before the actual BER test by temporarily pinning the cell in the high or low resistance state to measure and record the expected mean voltages and standard deviations for the reflected signals, which are then used in the criteria for detecting when an error has occurred.

DETAILED DESCRIPTION OF THE INVENTION

In the following description of the embodiments, reference is made to the accompanying drawings that form a part hereof, and in which is shown by way of illustration of the specific embodiments in which the invention may be practiced. It should be noted that the figures discussed herein are not drawn to scale.

Figure 1:
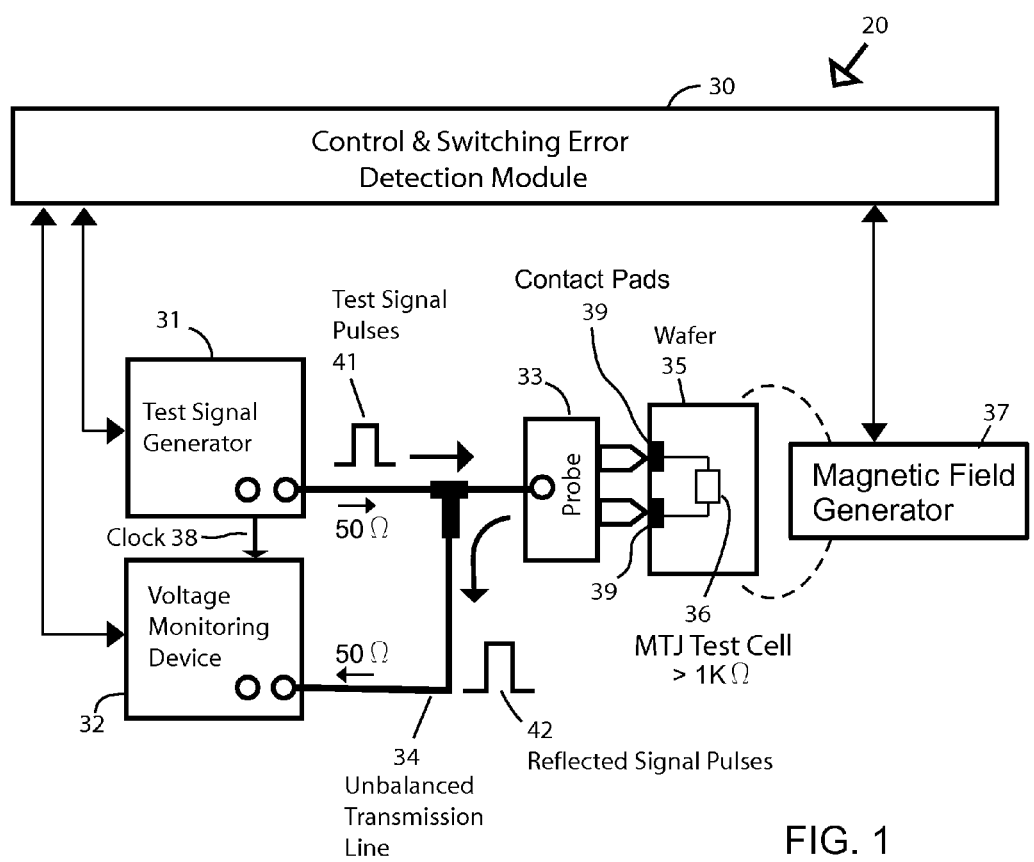
FIG. 1 is an illustration of a test system setup according to an embodiment of the invention.

A test system 20 for an embodiment of the invention for testing an MTJ memory cell is illustrated in FIG. 1. In this example test wafer 35 has been fabricated with MTJ test cell 36. The top and bottom electrodes (not shown) are directly connected to the two contact pads 39 on the surface of the wafer. The wafer can also have other MTJ test cells on it, and it can also have production MTJ-MRAM arrays with complete CMOS logic. As shown, two points on the electrical signal probe 33 are positioned in electrical contact with the two contact pads 39. The electrical signal probe 33 can be a standard commercially available multipoint probe. The mechanical test platform, which has means for positioning the probe and holding the wafer, can be according to the prior art and is not shown.

Figure 2:
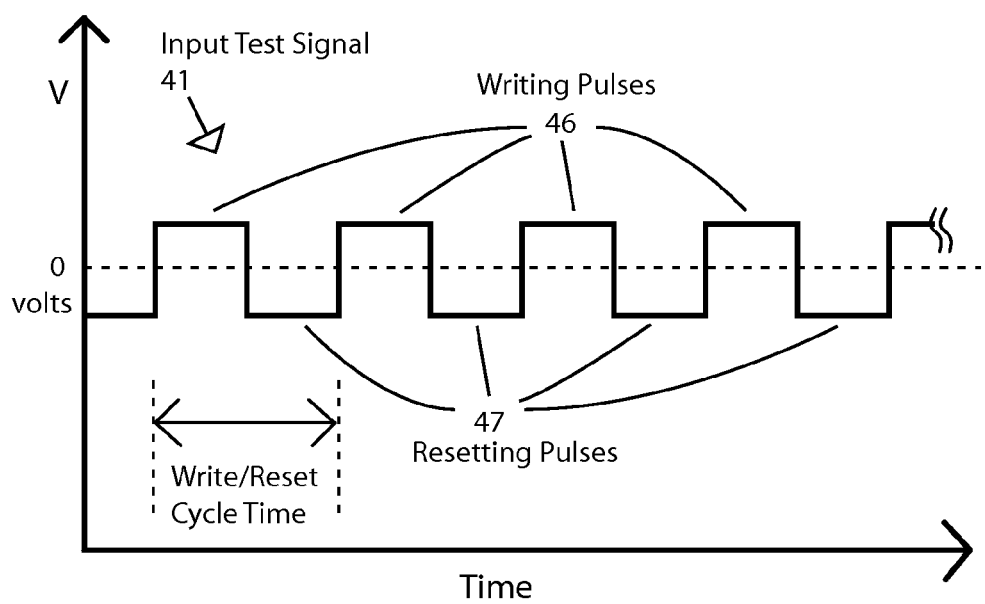
FIG. 2 is an illustration of an input test signal pulse train that will be used in an embodiment of the invention.

The input signal pulse train for the MTJ test cell 36 is generated by test signal generator 31 which can be a general purpose pattern/pulse generator, a pulsar board or another electronic device or circuit. The test signal generator 31 must be capable of producing the desired rate of write/reset pulses cycles, e.g. 1 MHz or higher. In this embodiment the signal generator 31 also supplies an optional clock signal 38 which is used by the voltage monitoring device (VMD) 32 to time the sampling of the reflected signal as will be further described below. The clock signal 38 is optional because the test signal in this embodiment is a simple waveform as shown in FIG. 2 and can be used as the timing signal. However, other more complicated test signals can be used, so for a general test setup the inclusion of the separate clock signal can be helpful.

FIG. 2 is an illustration of an example of an input test signal pulse train 41 that can be used in an embodiment of the invention. In this embodiment the test signal is simply a square wave with alternating polarity pulses. As shown the positive pulses are "writing pulses" and the negative pulses are "reset pulses" which are selected to switch the MTJ back and forth in the normal way. It does not matter whether the reset pulse is first or second in the sequence. The correct pulse width and pulse amplitude are selected according to the specifications of the test cell. As used herein the positive write pulse is assumed to switch the MTJ from the low resistance state to the high resistance state. If the opposite is true for a particular test setup, the appropriate substitutions in the text and figures can be made without changing the principles of the invention.

The voltage monitoring device (VMD) 32 and Control & Switching Error Detection Module (CSEDM) 30 in this embodiment perform as the switching error detection means. Many other combinations of standard laboratory devices and software can be used to implement the switching error detection function. In this embodiment the voltage monitoring device (VMD) 32 receives the reflected signals 42 from the MTJ test cell 36 on transmission line 34 along with the test signal. An optional signal amplifier can be used before the VMD to increase the signal level. The minimum requirement for the VMD is to measure the voltage level of each pulse in the reflected signal pulse train 42 in the selected sampling window and provide the raw data to the Control & Data Computation Module 30 for analysis. The trigger for the sampling window can be the supplied clock signal 38 or the test signal according to the embodiment.

The VMD can be a standard device such as an oscilloscope with data acquisition capability and an output port, or any device which can provide the required digital data for reflected signal pulse to a Control & Switching Error Detection Module (CSEDM) 30. In this embodiment the CSEDM detects and count the errors using the raw stream of sampled voltage values from the VMD, but in alternative embodiments the VMD could be selected or designed to perform more of the work of detecting and counting the pulses that indicate switching errors as described herein. For example, the VMD device can include a counter which is incremented each time an error event is detected and an error event can be logged if sampled reflected signal is below a user-defined threshold or outside of a range.

The CSEDM can be a general purpose computer equipped with standard input and output ports for controlling the test equipment and receiving the data from the VMD 32. Commercially available software packages can be used to aid in data collection and analysis, but typically a small software program for the computer will need to be written to detect and count the errors and calculate the BER according to the criteria described herein.

Transmission line 34 connects signal generator 31, voltage monitoring device (VMD) 32 and probe 33. The impedances in the setup are selected to create a mismatch that results in a measurable part of the power of the input pulse being reflected back from the MTJ cell 36 on the transmission line 34 to VMD 32. A typical MTJ device on a wafer or chip can be expected to have an load impedance greater than 1 k ohms. Therefore, in this case the standard transmission line impedance of 50 ohms should result in an adequate amount of the power of the input pulse being reflected back to the VMD. Conveniently, the signal generator 31, VMD 32, and probe 33 can all be standard commercially available devices with the standard 50 ohms impedance, so that no steps to alter the impedance presented to the memory cell through the probe are required.

The output pulse voltage level is given by:

$$V_{reflect} = V_{in} \times ((Z_L - Z_T)/(Z_L + Z_T))$$

where $V_{reflect}$ is the voltage level of the reflected pulse, $V_{in}$ is the voltage level of the input pulse. $Z_L$ is the load impedance and $Z_T$ is transmission line impedance. If we consider the MTJ device as a pure resistor, then $Z_L = R_{MTJ}$.

From the above equation, the reflected pulse voltage level will, therefore, depend on MTJ resistance $R_{MTJ}$ and can be used to indicate whether the selected MTJ is in the high resistance state ($R_{high}$) or low resistance state ($R_{low}$).

Figure 3:
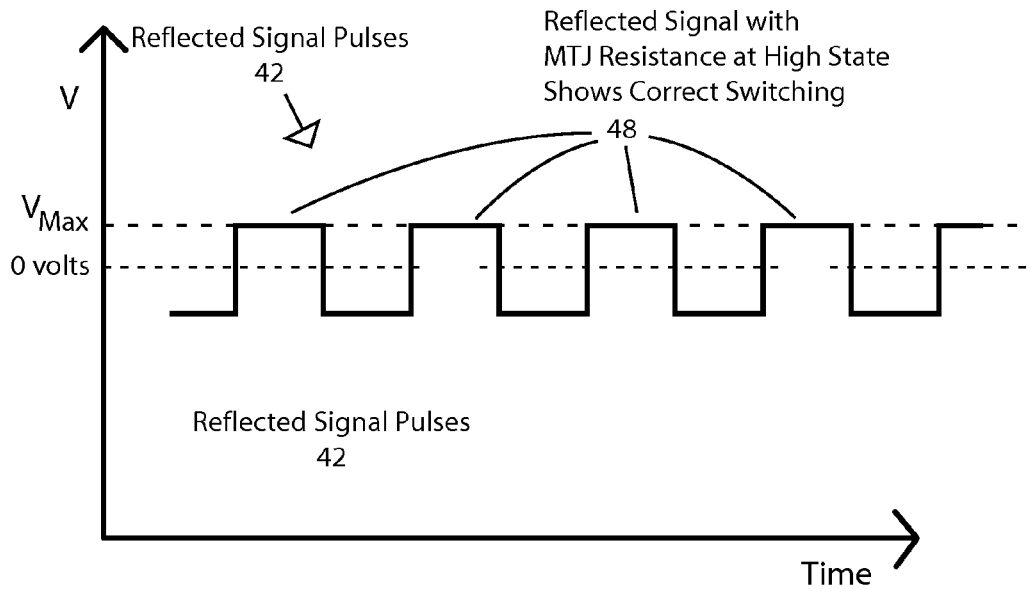
FIG. 3 is an illustration of a reflected pulse train generated with a normal write pulse voltage which gives a very low switching error rate that will be used in descriptions of the invention.

Standard BER tests iteratively use a sequence of write voltages that are selected to include voltages that are lower than the specified operational voltage in order to obtain higher BERs along with the BER for the correct operational voltage and pulse width. The lowest selected voltage can result in a BER equal to 1, i.e. 100% failure, while the optimum BER for the cell is many decades lower. FIG. 3 is an illustration of a reflected pulse train generated with normal write-pulse voltage which gives a very low switching error rate. In this example there are no switching errors, so the reflected signal pulses form a regular pattern with each reflected pulse generated by a positive write pulse reaching the same maximum voltage level. The reflected signal tracks the test signal although slightly delayed.

Figure 4:
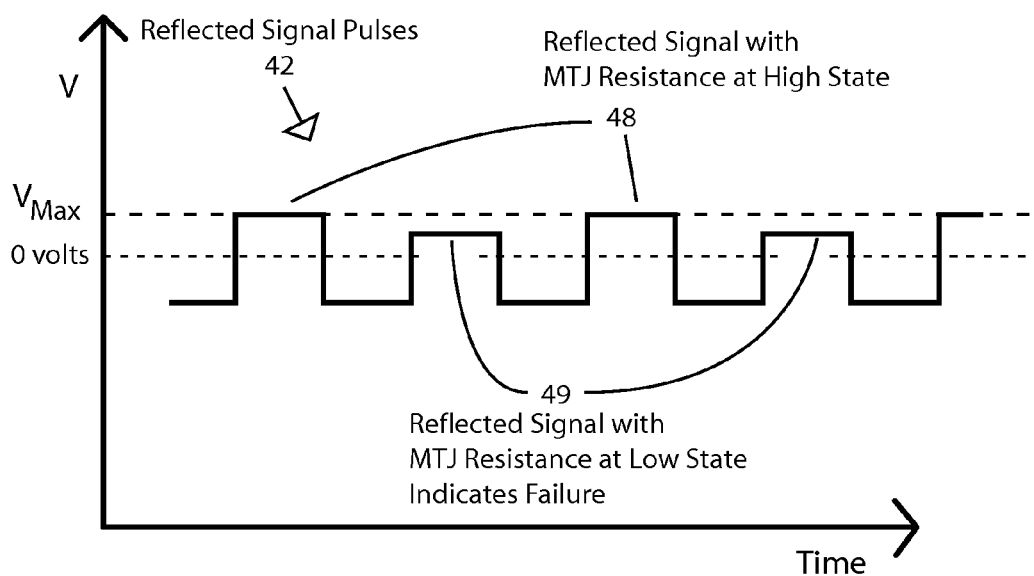
FIG. 4 is an illustration of a reflected signal pulse train generated by using a low write pulse voltage selected to cause a high switching error rate that will be used in descriptions of the invention.

FIG. 4 is an illustration of a reflected signal pulse train generated in a test setup according to the invention using a low write-pulse voltage selected to cause a high switching error rate. In this example the reset pulse is maintained at the correct operational voltage and pulse width to reliably switch the cell. The result as shown is that when the cell stays in the reset state which corresponds to its lower resistance level ($R_{low}$) the voltage of the reflected signal pulses 49 is lower than the reflected signal pulses 48. This example shows two failures close together in time, but for low BERs the failing pulses will be relatively rare and far apart on average.

Figure 5:
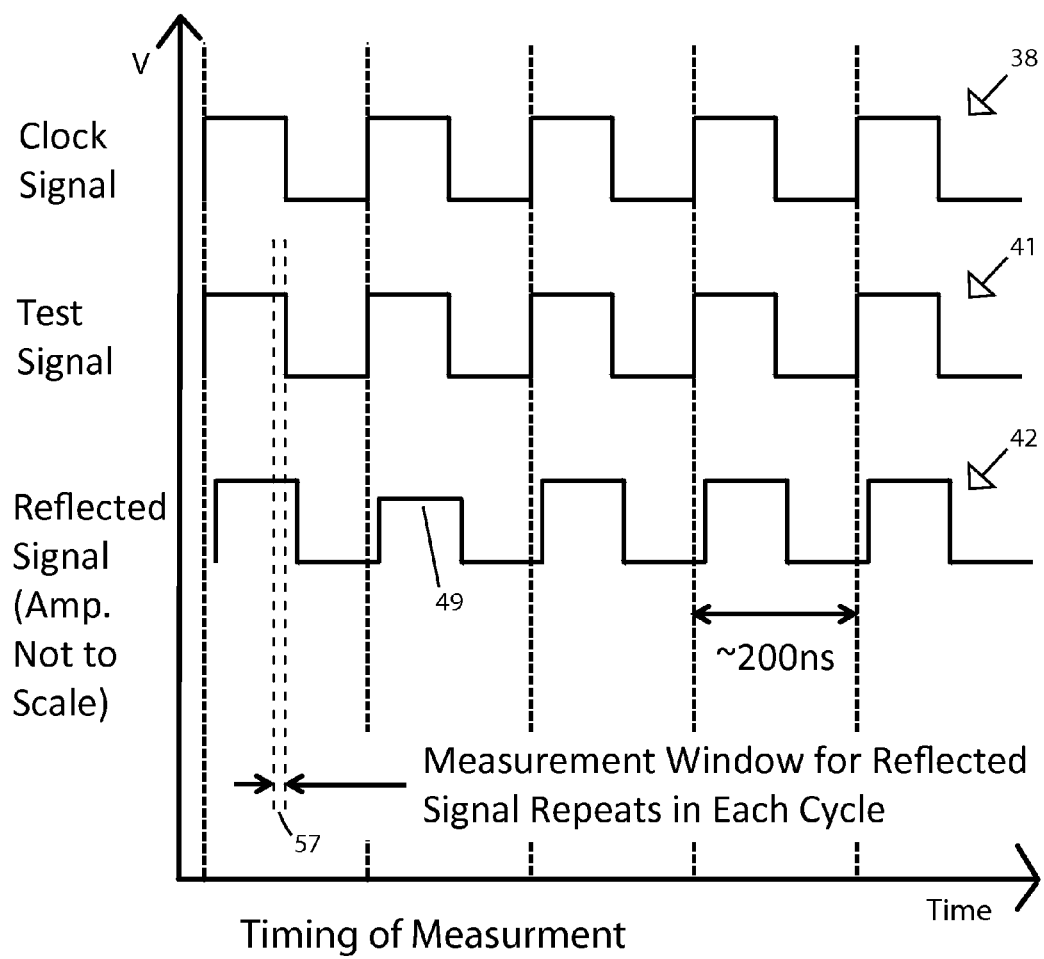
FIG. 5 is an illustration of the timing of the sampling of the reflected signal pulse train in an embodiment of the invention.

FIG. 5 illustrates the timing of the two signals on the transmission line during a test (the test signal pulses 41 generated by the signal generator and the reflected signal pulses) and the clock signal 38 which goes directly to the VMD 32. FIG. 5 illustrates the relative timing of the three signals and the sampling window 57 for the reflected signal pulses. The reflected signal is small in comparison to the test signal and has been exaggerated in FIG. 5 for illustration purposes. In this example the test signal is a stable square wave and is therefore, easily cancelled out in the measuring process. For example, using a standard laboratory oscilloscope an offset voltage can be set to cancel out the test signal component from the composite signal that is input to the VMD. Other standard means of separating the small reflected signal from the composite signal for measurement can be used as well.

In the example illustrated in FIG. 5, the cycle time of the test signal and the clock are 200 ns. The VMD sampling window 57 is approximately 10 ns and is positioned near the end of each write cycle, which avoids the small initial delay period for the reflected signal. The expected time delay between the test signal 41 and the reflected signal 42 is very small (e.g. less than 1 ns), which makes it negligible under the test parameters described.

The sampling window 57 is repeated on each cycle but is shown in only one cycle in the figure for simplicity. In the embodiment using a VMD such as laboratory oscilloscope set to cancel out the repetitive test signal, the data going to the CDCM 30 is a continuous stream of raw data that consists of the voltage measurement of the reflected signal in the sample window 57 for each cycle. The task of the CDCM 30 is then to determine whether the voltage of the reflected signal pulse indicates switching success or failure as discussed herein and compute a BER.

The criterion for deciding when a switching success or failure has occurred can be determined empirically given the goals of the test, the details of the test setup, the particular MTJ design, etc. After the test setup configuration has been determined and a test MTJ has been fabricated, one way to set the criterion is to empirically determine the mean and standard deviation ($\sigma$) of the voltage of the reflected signal that corresponds to switching failure (low resistance state 49 in FIG. 4) by selecting test parameters that generate a sufficiently high BER to get the needed samples. Applicants have found in experiments using particular experimental MTJs that the voltage of the reflected signal for successful and failing switching typically differs by 15 to 25 standard deviations. Given this large separation, selecting a $\pm 3\sigma$ band around the mean voltage provides a good test criterion. In this case the program in the CDCM 30 is designed to count as a failure any reflected signal voltage that falls inside of a $\pm 3\sigma$ band around the empirically determined mean voltage. Obviously this particular criterion is somewhat arbitrary and other criteria can reasonably be applied to the data set generated in embodiments of the invention by practitioners skilled in the art.

For comparison purposes a particular MTJ device on a wafer was tested using an embodiment of the invention and the prior art method. Two essentially identical BER test curves using six selected voltages were generated. The six BER values ranged from 1 to 0.00001. The method of the invention and the prior art yielded essentially identical data at each voltage. However, the test according to the invention took 1 minute while the prior art method took 500 minutes. Therefore, the invention was shown to be greatly superior to the prior art.

Pre-Test Calibration Embodiments

In alternative embodiments the test system with a test cell connected can be self-calibrated before the actual BER test by temporarily pinning the cell in the high or low resistance state to measure and record the expected mean voltages and standard deviations for the reflected signals. The test setup in FIG. 1 includes optional external magnetic field generator 37, which is controlled by the CDCM 30, to selectively apply a magnetic field to the MTJ cell being tested to temporarily pin the cell in the high or low resistance state. An alternative way to temporarily pin the MTJ is to apply DC voltage or current through the test cell. The AC pulses are then superimposed on the DC signal to achieve the same results as when the external magnetic field is used. The following discusses the embodiment using the external magnetic field generator, but the DC bias can be used in the same way.

The external magnetic field is used in determining the characteristics (calibrating) of the test system setup with the MTJ cell connected. The pre-test determination of the reflection voltage level and standard deviation at the VMD when the MTJ cell is in the high resistance state is conveniently done by biasing (pinning) the MTJ cell into the high resistance state by applying a selected external magnetic field, i.e. with the orientation of the free layer antiparallel to the reference layer. With the cell magnetically pinned, the test signal generator can send write pulses to the MTJ without causing the cell to switch. The reflection voltage level in this configuration can be measured repeatedly by the VMD which sends the sample values to the CDCM. The CDCM then uses the set of measured values to calculate the mean and the standard deviation which are then used to define the error threshold as described above for the expected high value of the reflected signal ($V_{rhigh}$). This procedure can be repeated for selected test signal voltage levels.

A similar procedure can be applied to get $V_{rlow}$ mean value and standard deviation with the external magnetic field biasing MTJ into $R_{low}$ state, i.e. with the orientation of the free layer parallel to the reference layer. These calibration values can then be used by the CDCM to compare the measured reflected voltage level during the actual test to determine whether the MTJ has switched.

Embodiment Using Read Pulses

Figure 6:
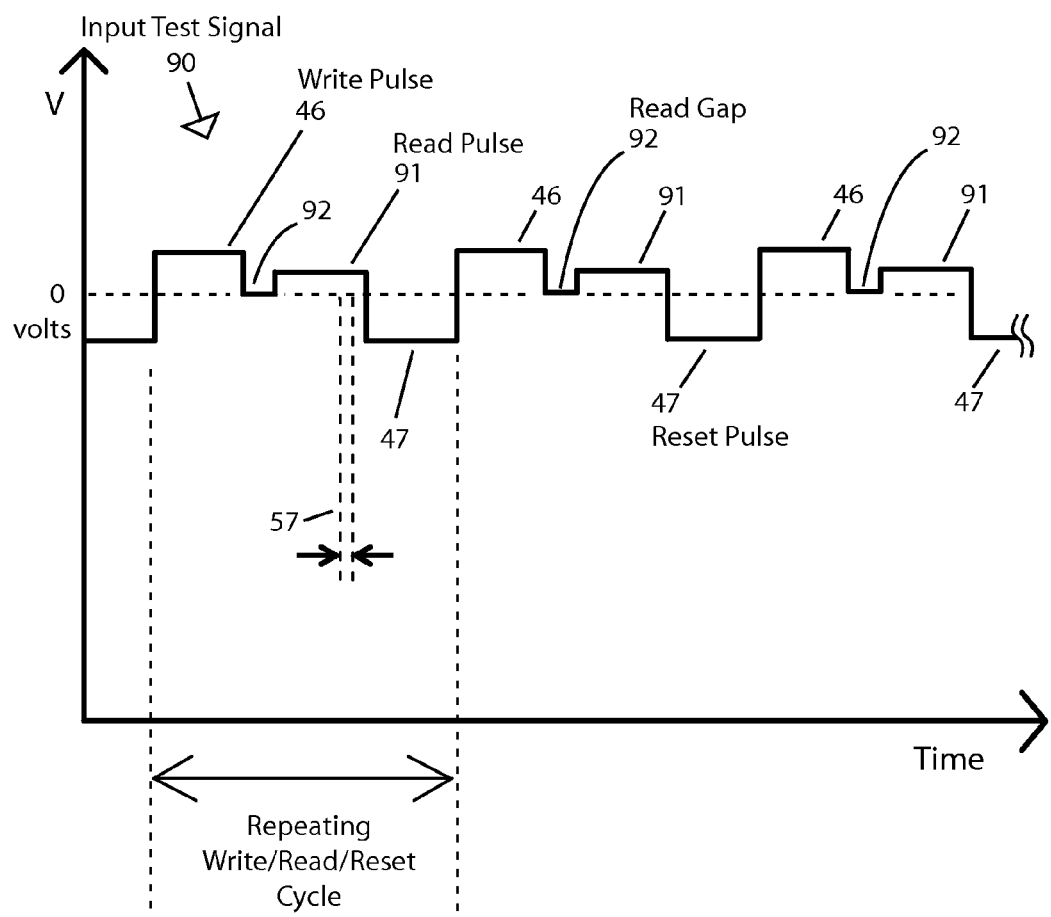
FIG. 6 is an illustration of an input test signal pulse train that includes a read pulse used in an embodiment of the invention.

In an alternative embodiment the test signal generator is used to send a repeating sequences of write pulse, read pulse and reset pulse to the MTJ device under test. The additional read pulses are used to measure the high/low resistance state after the write pulse has ended. FIG. 6 illustrates an example input signal 90 that includes read voltage pulses 91 in each cycle. The read pulse voltage is selected according to the design of the MTJ using standard principles. The read pulse either has a low voltage level (as shown in FIG. 6) or has a short pulse width (not shown) in order to make sure that it will not switch the MTJ. Between the write pulse 46 and the read pulse 91, the read gap 92 is a period when the test signal is at zero for a brief time. The read gap 92 allows time for relaxation of magnetic moment of the MTJ free layer after the writing current has ended to improve the accuracy of the BER measurement. In actual field use of a cell with associated CMOS logic, the average time and even the minimum time between write pulse and a read pulse can be expected to be much larger than in the test scenario. Having too small of a time period after the end of the write current could result in the read operation overlapping the period when the magnetic moment has not returned to its static state as it would in normal use and the accuracy of the test could be affected. The length of the read gap 92 can be selected based on an estimated magnetization relaxation time and/or empirically. Accordingly it might be convenient if the test signal generator setup allows adjustment of the length read gap 92 to experimentally determine the best value.

As described above for the write pulse, the read pulse also generates a corresponding reflected signal, which is measured during the test in sample window 57 and the value is transmitted to the CDCM. An embodiment using a read pulse after the write pulse does not require the pinning means for the pre-test calibration described above. However, the pre-test calibration process for this embodiment should include finding the mean and standard deviation for the reflected read pulse voltages for the high and low resistance states of the MTJ, which can be set by the write and reset pulses instead of the magnetic field or DC bias. The CDCM compares the level of the reflected signal for the read pulse during the actual test with the two pre-test calibration reflection read pulse voltages to determine whether MTJ has switched. In this embodiment the sample measurement window 57 for the reflected signal occurs during the read pulse, preferably near the end of the pulse as was discussed above. Except for the addition of the read voltage pulse, this embodiment is otherwise similar to the embodiment described above.

Although the present invention has been described in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

The invention claimed is:

1. A method for testing a memory cell, the memory cell having a low resistance state and a high resistance state that can be switched by predetermined voltage pulses applied to the memory cell, the method comprising:
   connecting a test system to the memory cell, an impedance of the test system presented to the memory cell being unequal to an impedance of the memory cell when a selected test signal is applied;
   applying the selected test signal to the memory cell, the selected test signal including a repeating cycle of voltage pulses selected to cause repetitive switching between the low resistance state and the high resistance state and to cause a reflected signal from the memory cell back to the test system, the reflected signal varying in an expected pattern when the memory cell switches between the low resistance state and the high resistance state; and
   detecting a switching error when the reflected signal differs from the expected pattern.

2. The method of claim 1 further comprising:
   counting a number of cycles of voltage pulses during a test;
   counting a number of switching errors during the test; and
   calculating a bit-error rate for the memory cell by dividing the number of switching errors by the number of cycles of voltage pulses.

3. The method of claim 1 detecting a switching error when the reflected signal differs from the expected pattern further comprises:
   repeatedly measuring a voltage of the reflected signal in at least one selected measurement window in the repeating each cycle of voltage pulses; and
   determining whether the voltage of the reflected signal falls outside of a predetermined range indicating that a switching error has occurred.

4. The method of claim 3 further comprising:
   before applying the selected test signal, pinning the memory cell in the low or high resistance state;
   repeatedly applying a selected voltage pulse to the memory cell, the selected voltage pulse being a voltage pulse included in the test signal;
   repeatedly measuring a voltage value of the reflected signal corresponding to the selected voltage pulse in a second selected measurement window, and using an average of the voltage values of the reflected signal as an expected voltage of the reflected signal corresponding to the selected voltage pulse;
   using the expected voltage of the reflected signal corresponding to the selected voltage pulse to define the predetermined range indicating that correct switching has occurred; and
   unpinning the memory cell.

5. The method of claim 4 further comprising calculating a standard deviation of the voltage values of the reflected signal and defining the predetermined range indicating that correct switching has occurred as a selected number of standard deviations around the expected voltage.

6. The method of claim 4 wherein pinning the memory cell further comprises applying a selected magnetic field to the memory cell.

7. The method of claim 4 wherein pinning the memory cell further comprises applying a selected DC voltage or current to the memory cell.

8. The method of claim 1 wherein the memory cell is a magnetic tunnel junction (MTJ) cell, a phase change memory cell, a resistive memory cell or a Memristor.

9. The method of claim 1, wherein the repeating cycle of voltage pulses is a square wave including alternating positive and negative pulses.

10. The method of claim 1, wherein the repeating cycle of voltage pulses includes a write pulse and a reset pulse that switch a resistance state of the memory cell and further includes a read pulse that does not switch the resistance state of the memory cell and the method further comprises repeatedly measuring a voltage of the reflected signal in at least one selected measurement window in the repeating cycle of voltage pulses during the read pulse.

11. The method of claim 10, wherein the repeating cycle of voltage pulses includes a read gap between the write pulse and the read pulse and the memory cell returns to a stable magnetic state during the read gap.

12. An apparatus for testing a memory cell having a low resistance state and a high resistance state that can be switched by positive and negative voltage pulses applied to the memory cell, comprising:
   a probe for making electrical connections to the memory cell and presenting an impedance to the memory cell selected to cause signal reflections from the memory cell when a selected test signal is applied to the memory cell through the probe;
   a transmission line connected to the probe;
   a test signal generator for applying the selected test signal to the memory cell through the transmission line connected to the probe, the test signal including a repeating cycle of voltage pulses that includes at least a positive pulse and a negative pulse selected to cause the memory cell to repeatedly switch between the low resistance state and the high resistance state and to cause signal reflections from the memory cell on the transmission line in a predetermined pattern that is a function of a resistance state of the memory cell; and
   switching error detection means for detecting switching errors when the signal reflections from the memory cell deviate from the predetermined pattern.

13. The apparatus of claim 12 wherein the switching error detection means includes a voltage monitoring device that measures a voltage value of a reflected signal on the transmission line in at least one selected measurement window in each cycle.

14. The apparatus of claim 13 wherein the switching error detection means includes a computer that receives the voltage value of the reflected signal from the voltage monitoring device and executes a program to compare the voltage value of the reflected signal in the selected measurement window in each cycle to an expected voltage value and detects a switching error when the voltage value of the reflected signal differs from the expected voltage value by a predetermined amount.

15. The apparatus of claim 12 wherein the switching error detection means includes a voltage monitoring device that samples a voltage value of a reflected signal on the transmission line in at least one selected measurement window in each cycle and a counter which is incremented if the the voltage value is below a predetermined threshold.

16. The apparatus of claim 12 wherein an impedance presented to the memory cell by the probe is unequal to an impedance of the memory cell in either the low resistance state or the high resistance state when the selected test signal is applied to the memory cell.

17. The apparatus of claim 12 wherein an impedance presented to the memory cell by the probe is lower than an impedance of the memory cell in the low resistance state when the test signal is applied to the memory cell.

18. The apparatus of claim 12 further comprising calibration means for applying the selected test signal to the memory cell, repeatedly measuring a voltage value of a reflected signal in a selected measurement window, calculating an average of the voltage values as an expected voltage of the reflected signal in the predetermined pattern.

19. The apparatus of claim 12 wherein the switching error detection means compares a voltage value of a reflected signal in a selected measurement window in each cycle to an expected voltage value and detects a switching error when the voltage value of the reflected signal differs from the expected voltage value by a predetermined amount, the apparatus further comprising:

programmable bias means for pinning the memory cell in a selected resistance state; and a control module for controlling a test calibration process for determining the expected voltage value including activating the programmable bias means to pin the memory cell in the low resistance state or the high resistance state, applying the selected test signal to the memory cell, repeatedly measuring the voltage value of the reflected signal in a selected measurement window, calculating an average of the voltage values of the reflected signal as the expected voltage value of the reflected signal to be used by the switching error detection means.

20. The apparatus of claim 19 wherein the test calibration process includes calculating a standard deviation of the voltage values of the reflected signal and the switching error detection means detects a switching error when one of the voltage values of the reflected signal differs from the expected voltage value by a predetermined amount that is a number of standard deviations.

* * * * *